(12) United States Patent
Berben et al.

(10) Patent No.: US 9,103,526 B2
(45) Date of Patent: Aug. 11, 2015

(54) PHOSPHOR ASSEMBLY WITH PHOSPHOR ELEMENT AND OPTICAL SYSTEM

(75) Inventors: Dirk Berben, Herdecke (DE); Ulrich Hartwig, Berlin (DE)

(73) Assignee: OSRAM GmbH, Munich (DE)

( * ) Notice: Subject to any disclaimer, the term of this patent is extended or adjusted under 35 U.S.C. 154(b) by 8 days.

(21) Appl. No.: 13/883,997

(22) PCT Filed: Nov. 9, 2010

(86) PCT No.: PCT/EP2010/067083
§ 371 (c)(1),
(2), (4) Date: May 8, 2013

(87) PCT Pub. No.: WO2012/062355
PCT Pub. Date: May 18, 2012

(65) Prior Publication Data
US 2013/0229787 A1  Sep. 5, 2013

(51) Int. Cl.
| F21V 9/00 | (2006.01) |
| F21V 9/12 | (2006.01) |
| F21V 9/08 | (2006.01) |
| G02B 6/42 | (2006.01) |
| G02B 7/00 | (2006.01) |
| G02B 19/00 | (2006.01) |
| F21V 9/16 | (2006.01) |
| F21V 29/00 | (2015.01) |

(Continued)

(52) U.S. Cl.
CPC ... F21V 9/12 (2013.01); F21V 9/08 (2013.01); F21V 9/16 (2013.01); G02B 6/4206 (2013.01); G02B 7/008 (2013.01); G02B 19/0014 (2013.01); G02B 19/0028 (2013.01); G02B 19/0052 (2013.01); F21V 29/30 (2013.01); H01L 33/50 (2013.01); H01L 33/58 (2013.01)

(58) Field of Classification Search
CPC .............. F21V 9/04; F21V 9/12; F21V 9/08; F21V 9/16; G02B 6/4206
USPC ........... 362/294, 461, 547, 84, 562, 101, 318; 353/52–61; 359/200.4, 200.5, 226.3, 359/228
See application file for complete search history.

(56) References Cited

U.S. PATENT DOCUMENTS 4,704,660 A * 11/1987 Robbins ........................ 362/552
5,801,792 A *  9/1998 Smith et al. ................... 348/749

(Continued)

FOREIGN PATENT DOCUMENTS

CN   101649965 A   2/2010
EP      1998102 A1  12/2008

(Continued)

OTHER PUBLICATIONS

English language abstract of CN 101649965 A of Feb. 17, 2010.

(Continued)

Primary Examiner — Peggy Neils
Assistant Examiner — Zheng Song (57) ABSTRACT

This invention relates to a phosphor assembly with a phosphor element for converting pump light into converted light, and an optical system for transmitting converted light and/or pump light. Therein, a liquid immersion material is provided in a gap between the phosphor element and the optical system, wherein an excess of immersion material enables a continuous exchange of the material in the gap and thus provides a cooling.

11 Claims, 7 Drawing Sheets

(51) Int. Cl.
*H01L 33/50* (2010.01)
*H01L 33/58* (2010.01)

(56) References Cited

U.S. PATENT DOCUMENTS

| | | |
|---|---|---|
| 6,259,103 B1 * | 7/2001 | Pressnall .................... 250/483.1 |
| 7,500,776 B1 * | 3/2009 | Buczko ........................ 362/562 |
| 2002/0003704 A1 * | 1/2002 | Ohmae et al. ................ 362/293 |
| 2002/0015305 A1 * | 2/2002 | Bornhorst et al. ............ 362/293 |
| 2004/0246700 A1 * | 12/2004 | Palmer et al. .................. 362/34 |
| 2005/0270775 A1 * | 12/2005 | Harbers et al. ................ 362/231 |
| 2006/0256300 A1 * | 11/2006 | Chin et al. ...................... 353/81 |
| 2007/0019408 A1 * | 1/2007 | McGuire et al. ............. 362/231 |
| 2007/0146639 A1 | 6/2007 | Conner |
| 2008/0094835 A1 * | 4/2008 | Marra et al. .................. 362/247 |
| 2009/0034284 A1 * | 2/2009 | Li et al. ......................... 362/554 |
| 2010/0128462 A1 * | 5/2010 | Chern et al. .................... 362/84 |
| 2011/0116253 A1 * | 5/2011 | Sugiyama ....................... 362/84 |
| 2011/0149549 A1 * | 6/2011 | Miyake ........................... 362/84 |
| 2011/0211333 A1 * | 9/2011 | Bartlett ........................... 362/84 |
| 2011/0261563 A1 * | 10/2011 | Li ................................. 362/235 |
| 2011/0280033 A1 * | 11/2011 | Kishimoto et al. ........... 362/543 |

FOREIGN PATENT DOCUMENTS

| | | |
|---|---|---|
| JP | 2011075657 A | 4/2011 |
| JP | 2011243375 A | 12/2011 |
| JP | 2012078707 A | 4/2012 |
| WO | 2006102846 A1 | 10/2006 |

OTHER PUBLICATIONS

English language abstract of JP 2011243375 A of Dec. 1, 2011.
English language abstract of JP 2012078707 AofF Apr. 19, 2012.
English language abstract of JP 2011075657 A of Apr. 14, 2012.
Office action issued in the corresponding Chinese application No. 201080065811.X dated Mar. 3, 2014, 6 pages.
Office action issued in the corresponding Japanese application No. 2013-538077 dated Mar. 3, 2014, 2 pages.

* cited by examiner

PHOSPHOR ASSEMBLY WITH PHOSPHOR ELEMENT AND OPTICAL SYSTEM

RELATED APPLICATIONS

The present application is a national stage entry according to 35 U.S.C. §371 of PCT application No.: PCT/EP2010/067083 filed on Nov. 9, 2010.

TECHNICAL FIELD

Various embodiments relate to a phosphor assembly comprising a phosphor element for converting pump light into converted light, and an optical system for transmitting at least a part of the converted light and/or of the pump light.

BACKGROUND

In applications that vary from projection systems to optical fiber coupled illumination in endoscopy, there is an increasing need for high brightness illumination sources. Therein, bright discharge lamps are the state of the art broadly used today. The latest developments are combining light sources having a high power density, e.g. a LASER source (for example a laser diode), with light (here also encompassing invisible ultraviolet and infra-red radiation) converting phosphor elements remote from the exciting light source. In this way, typically ultra-violet or blue pump light can be converted to light having a longer wavelength by the phosphor (down conversion).

Various embodiments provide an improved phosphor assembly for converting pump light.

SUMMARY

Various embodiments provide a phosphor assembly with a phosphor element and an optical system for transmitting pump light and/or converted light, wherein a liquid immersion material can be provided between the phosphor element and the optical system. Therein, the total volume of the liquid immersion material is adapted for an excess during phosphor assembly operation such that at a time not more than 50%, preferably not more than 45%, 40%, 35%, 30%, 25%, 20%, 15%, 10%, 5%, 0.5%, 0.05% of this total volume are penetrated by the light, which is transmitted by the optical system towards the phosphor element (pump light) and/or away from the phosphor element (converted light). Thus, these percentages relate to that part of the volume between the phosphor element and the optical system, which is penetrated by pump light having been guided by the optical system and/or by converted light, which will be guided by the optical system, and is referred to as "gap" in the context of this application. In case the volumes defined by the converted light and the pump light differ, the larger one is referred to.

By providing a liquid immersion material between the optical system and the phosphor element, an air gap in the optical path can be avoided. Thus, Fresnel losses, which occur between media having different refractive indices, can be reduced initially. Further, light is refracted away from the optical axis at a transition from a medium having a higher refractive index to air, which causes additional losses. By providing an immersion material, these refractive losses can be reduced or even be decreased to zero, for instance if the refractive index of the immersion material is chosen between those of the phosphor element $n_p$ and the optical system $n_{os}$. For optimum results, the refractive index of the immersion material can for example be chosen equal to the square root of the product of the indices $n_p$ and $n_{os}$. As a result, the light collection efficiency of the phosphor assembly can be improved.

According to various embodiments, an excess of immersion material is provided, namely more immersion material than needed to fill the gap between the optical system and the phosphor element. In this way, a continuous exchange of immersion material in use (converting light) is possible, most simply by convection. The inventors found that the exchange of immersion material dissipates heat, which can be generated within the phosphor element due to the stokes shift and a possible parasitic absorption of the phosphor, which can for example be caused by lattice defects or auxiliary crystallographic phases. Thus, the excess immersion material has a cooling effect; the diffusion and thus the cooling can for instance increase with an increasing temperature gradient, which is self-regulating. Besides the convection mechanism, the excess immersion material can also act as a heat capacity or heat sink in general.

Further, the inventors observed an aging of the liquid immersion material at increased temperatures and for high radiant intensities. Therefore, the excess of immersion material can advantageously reduce an average damaging thereof and thus increase the lifetime of the whole assembly.

In this context, various embodiments also provide a method for converting light, wherein a liquid immersion material is provided between a phosphor element and an optical system, and is continuously exchanged during the pump light conversion.

In general, the optical system can have a double function and be provided for collecting and guiding converted light and/or for guiding pump light. Therein, the optical system can be or comprise a non-imaging optical element, for example a hollow light pipe having a reflective coating at its inner surface or a dielectric light guide, which guides the light by total internal reflection within a core having a higher refractive index than a cladding or a surrounding medium, as for example air. Like-wise, the optical system can be or comprise an imaging optical element, for example a lens or lens system.

The phosphor element absorbs at least part of the pump light and emits converted light having a longer wave-length, wherein a spontaneous emission is dominant. Phosphor types illustrating, though not limiting various embodiments, are garnet type phosphors of the form $A_xB_y \cdot C_2Al_5O_{12}$ (A, B, C from Y, Al, Lu, Ga etc.), for instance Ce doped YAG (Yttrium Aluminum Garnet), Orthosilicates that can contain Sr, Ba, Ca etc., for example Eu doped Strontium Orthosilicate, Silicone-Aluminum-Oxy-Nitrides, or pure Nitridic phosphors.

Preferred embodiments appear from the dependent claims and the following description, wherein the details refer to all aspects of various embodiments and are considered as disclosed individually; various embodiments are not restricted to the apparatus category, but also disclosed in terms of a method or a use.

In a first embodiment, at least a part of the optical system co-defines a volume sealingly, which volume contains the liquid immersion material. "Co-defining" means that the phosphor element defines an outer surface of the volume together with further bordering means, as for example a wall portion. Hence, the immersion material can be put in direct contact to the optical system such that preferably no interlayer or glue requiring an additional index matching is needed.

According to a further embodiment, a volume containing the liquid immersion material is provided, which volume contains either the phosphor element or is co-defined sealingly by at least a part of the phosphor element. In the former case, the phosphor element is provided inside the volume and defines an inner surface thereof, whereas it defines an outer surface in the latter case. In this way, a direct contact between the immersion material and the phosphor element can for instance be ensured, which results in a good heat transport.

In a preferred embodiment, at least 5%, further preferred at least 10%, 15%, 20%, 25%, 30%, 35%, 40%, 45%, 50%, 55%, 60%, 65%, 70%, 75%, 80%, 85%, 90%, 95%, of the volume are filled with liquid immersion material. As a matter of course, the volume can also be completely filled with liquid immersion material, namely to 100%. The liquid immersion material can for example be an immersion oil, for instance Immersol® 518 F or Immersionsglycerin (Immersion glycerine) commercially available from the company Carl Zeiss.

According to a further embodiment, the assembly comprises a reservoir and a channel, wherein the liquid immersion material can be fed from the reservoir through the channel to the phosphor element. Feeding the immersion material actively can either support the exchange, if the phosphor element is covered by liquid anyway, or provide a wetting to a phosphor element being not constantly dipped into immersion material, so being not constantly covered.

The channel can be provided within the optical system itself, for example as a through hole leading to the gap, or alternatively adjacent to it.

In a further preferred embodiment, the assembly is adapted to transport liquid immersion material to the phosphor element, and to collect liquid immersion material draining off the phosphor element for recirculating it to the phosphor element. Preferably, the phosphor element is provided in or co-defines a sealed volume, in which the liquid immersion material is collected after flowing along the phosphor element by gravitation.

In a further embodiment, the optical system and the phosphor element are moveable with respect to each other. Likewise, a focal spot of the pump light can be displaced on the phosphor element, which reduces the average time of pump light interaction. The inventors observed an increased lifetime for phosphor elements in a moveable set-up, particularly for red phosphor types, which have a large wavelength difference between excitation and emission and thus suffer from an intense heating.

Advantageously, the immersion material provided in excess allows a continuous wetting, even though the phosphor element and the optical system are moved against each other; on the other hand, this movement supports the continuous exchange of the immersion material in the gap.

Further preferred, the phosphor element is mounted rotatably and can be moved on a circle around a rotational axis. Therein, the phosphor element can for instance be provided in a wheel-like setup, namely on a disk- or a ring-shaped substrate or as a monolithic phosphor wheel. A motor for driving the rotation can for example be provided outside of the volume containing the liquid immersion material, wherein either a shaft can be sealed against the volume or a magnetic clutch be applied.

Preferably, the motor is provided inside the sealed volume. Likewise, neither a turning shaft has to be sealed nor a magnetic clutch to be applied, which simplifies the setup. Advantageously, an immersion oil provided for the index matching can additionally act as a lubricant.

With the motor provided in the sealed volume being preferably a brushless motor, an abrasion of carbon electrodes, which can lead to a contamination of the immersion material, can be avoided.

In a further embodiment, a passageway for liquid immersion material is provided at the rotatable phosphor element radially inside the circular path to enable a flow of immersion material along the rotational axis. Thus, the phosphor element is for example not provided on a disk without through holes; instead, the phosphor element can for instance be spaced by spokes to the rotational axis, wherein passageways are provided between the spokes. Likewise, frictional forces between the wheel and the immersion liquid as well as turbulences, which can affect the optical transmission, can be reduced.

Further preferred, guiding means are provided at these passageways for guiding the flow of immersion material. Thus, the flow can be adapted to a specific application, wherein increasing the flow rate around the phosphor element will improve the cooling, whereas reducing the flow rate can avoid turbulences and thus stabilizes the optical output.

Various embodiments also provide a light source unit, which comprises a phosphor assembly according to the invention, and a pump light source for an emission of pump light, for instance a LASER or LED device.

Further, Various embodiment still further provide a use of a respective light source or of a phosphor assembly according to various embodiments for a fiber optical illumination or an application in a data projection system.

BRIEF DESCRIPTION OF THE DRAWINGS

In the drawings, like reference characters generally refer to the same parts throughout the different views. The drawings are not necessarily to scale, emphasis instead generally being replaced upon illustrating the principles of the disclosed embodiments. In the following description, various embodiments are described with reference to the following drawings, in which.

DETAILED DESCRIPTION

The following detailed description refers to the accompanying drawing that show, by way of illustration, specific details and embodiments in which the disclose embodiments may be practiced.

Figure 1:
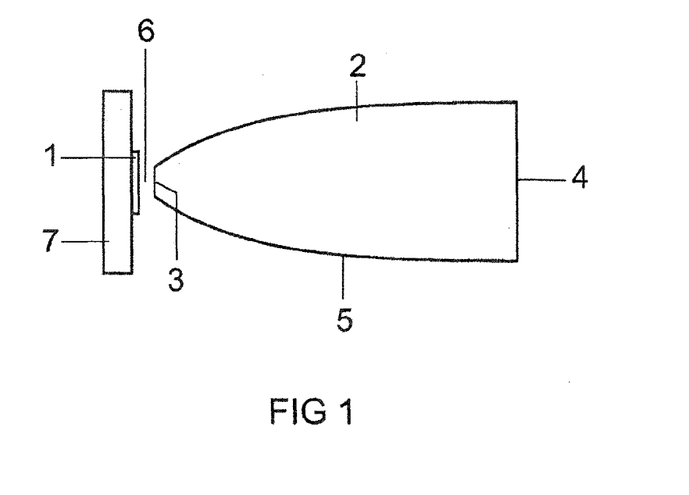
FIG. 1 illustrates a state of the art phosphor assembly with a phosphor element and a non-imaging optical system.

FIG. 1 shows a state of the art phosphor assembly with a phosphor element 1 and an optical system 2, which is made of optical glass, preferably quartz glass or BK7 having an refractive index of 1.46 and 1.52 in the visible spectral range. Thus, light entering the optical system 2 at one of the faces 3, 4 is guided by total internal reflexion at its side walls 5 to the respective opposite face 4, 3.

Therein, only the converted light rays lying inside the acceptance angle of the optical system 2 can be collected; rays missing the face 3 are lost. Therefore, the side walls 5 are not formed linearly but as Bezier curves (cross-sectional side view), whereby the acceptance angle at the face 3 is increased. In general, acceptance losses are increasing with an increasing gap 6 between the phosphor element 1 and the optical system 2.

The phosphor element 1 is provided on a heat sink 7 and is operated in reflection mode; the non-imaging optical system 2 guides pump light to the phosphor element 1 and also collects the converted light from it for guiding it in an opposite direction for further use.

Figure 2A:
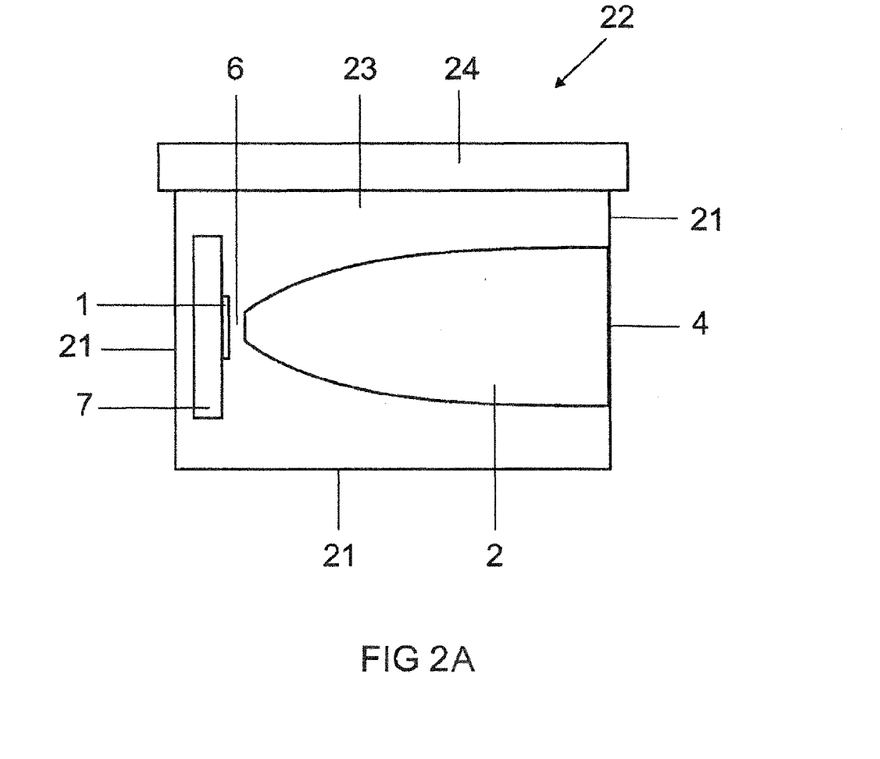
FIGS. 2A to 2C show a phosphor assembly with a volume containing liquid immersion material sealingly.

FIG. 2A shows a phosphor assembly with a phosphor element 1, a non-imaging optical system 2, and a heat sink 7; therein, the optical system 2 co-defines a volume together with wall portions 21 of a container 22, which is filled with immersion oil 23 and sealed with a lid 24.

Thereto, the non-imaging optical system 2 is fitted into a recess in the right sidewall 21 such that the face 4 of the optical system 2 is even with the outer surface of the wall portion 21. Alternatively, the exit face 4 could be attached to the inner surface of a translucent wall portion 21 (and the optical system would still define an outer surface of the volume for the liquid and thus be "co-defining" it), for instance by an index matched glue.

The immersion oil has a refractive index of 1.63, which is the optimum for a non-imaging optical system 2 made of quartz glass ($n_{os}=1.46$) and a garnet type phosphor element 1 having a refractive index of $n_p=1.83$; thus, Fresnel and refraction losses are reduced. For Nitridic phosphors having a refractive index of about 2.1, an optimum refractive index of the immersion oil would for instance be about 1.75 (referring in the whole paragraph to the visible spectral range).

Figure 2B:
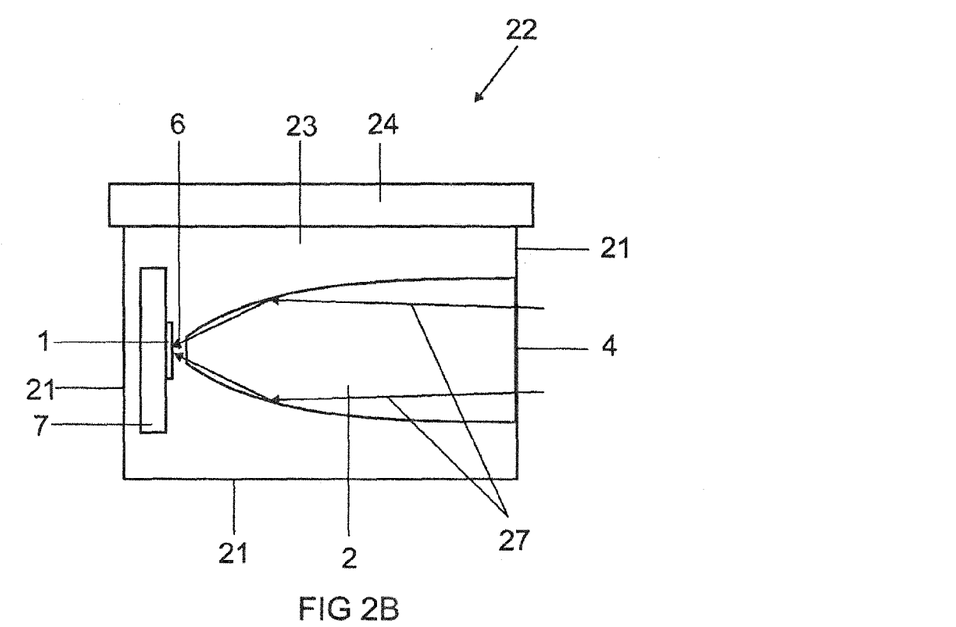
Figure 2C:
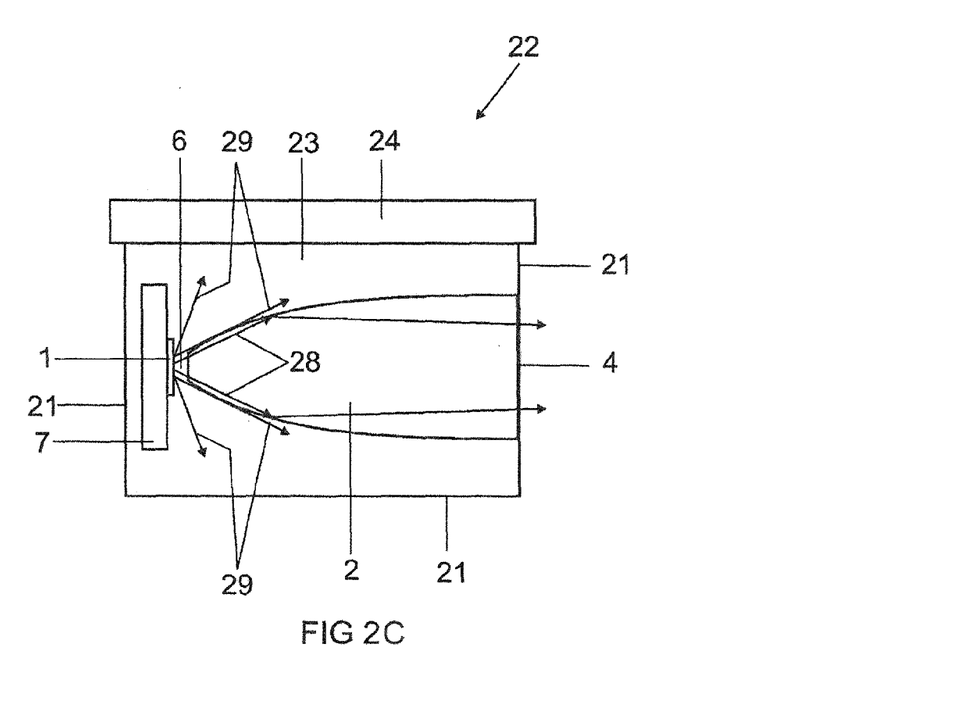

During operation, only the immersion oil in the gap 6 is penetrated by light, which has been transmitted (pump light, see FIG. 2B) or will be transmitted by the optical system 2 (converted light, see FIG. 2C). Since the phosphor element 1 is a Lambertian source emitting into a hemisphere, the converted light can usually not be collected entirely. Nevertheless, the gap 6 will typically be the region of the liquid immersion material 23, which has the highest light power density such that for instance more than 90% of the total light power are observed in the gap 6. An excess of immersion material 23 is provided to enable a convection driven continuous exchange of the immersion oil in the gap and thus a convective cooling.

FIG. 2B shows a propagation of pump light 27 through the optical system 2 and the gap 6 to the phosphor element 1, wherein rays 27 defining the light beam are drawn.

FIG. 2C shows converted light being emitted from the phosphor element 1 and collected by the optical system 2. Therein, only the converted light rays 28, which lie inside the acceptance angle of the optical system 2 can be collected. The rays 29 missing the face 3 are lost. The gap 6 defined by the converted light rays collected 28 can for instance have a volume of about 0.002 $mm^3$ to 7 $mm^3$, assuming a distance between the phosphor element 1 and the optical system 2 of about 50 µm to 0.5 mm and a diameter of the emitting region of about 0.25 mm to 4 mm. The container 22 has a volume of about 4500 $mm^3$ to 15000 $mm^3$ such that the ratio of the total immersion oil volume to the volume of the gap 6 can lie between 600:1 and 7,500,000:1, depending on the specific setup and the percentage filling of the container 22 (100% assumed in this case).

Figure 3:
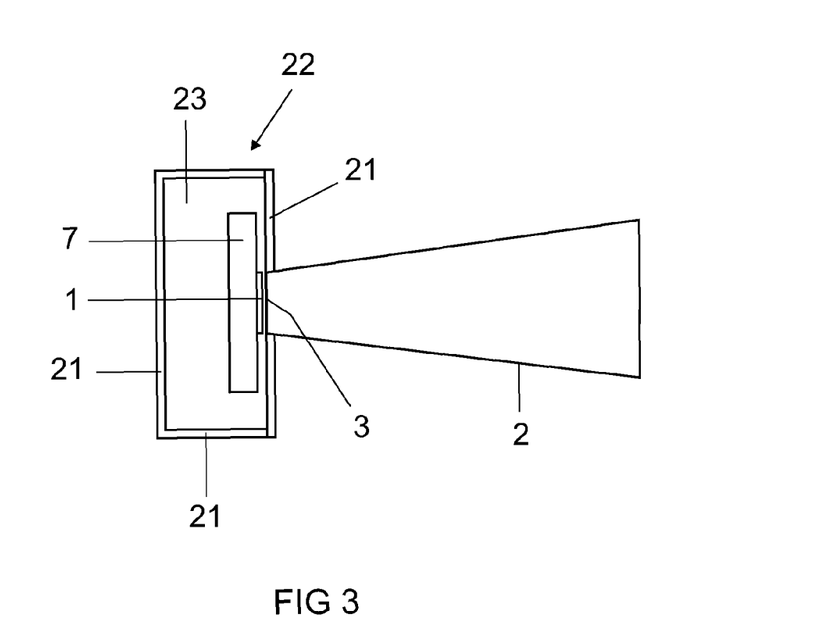
FIG. 3 illustrates a non-imaging optical system integrated into a side wall of a container for liquid immersion material.

FIG. 3 shows a setup with a container 22 for liquid immersion oil 23, wherein the recess in the right wall portion 21 is adapted for receiving the phosphor-sided end of the optical system 2 such that its face 3 is even with the inner surface of the wall portion 21. Also the volume for containing the immersion oil is reduced in this way, approximately to 2000 $mm^3$, there is still a significant excess of oil. In this case, the ratio of the total immersion oil volume to the volume of the gap can lie between 285:1 to 1,000,000:1.

Figure 4:
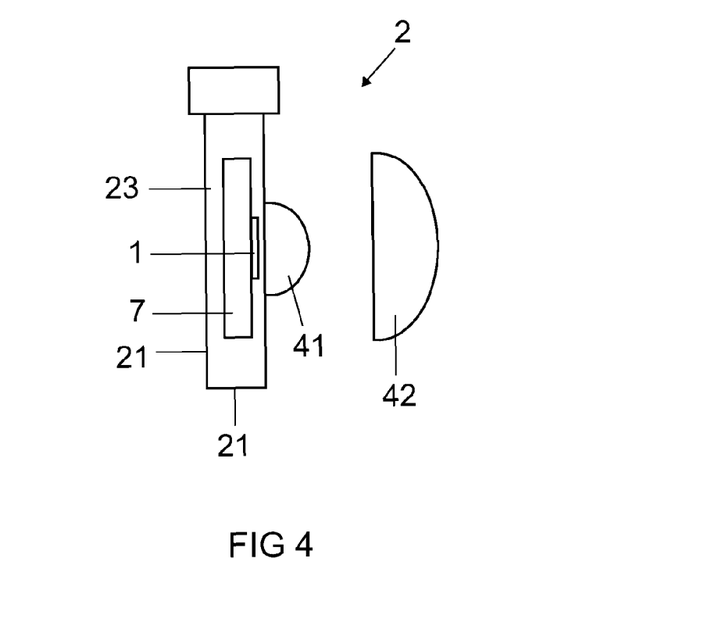
FIG. 4 shows a setup as the one of FIG. 3 with an imaging optical system.

FIG. 4 shows a setup similar to the one of FIG. 3, wherein the optical system 2 is an imaging lens system comprising a primary lens 41 and a secondary lens 42, which focus the pump light and collimate the converted light. The primary lens 41 is provided in a recess of the wall portion 21 and is even with the inner surface thereof. Alternatively, the lens 41 could also be attached to an inner or outer surface of a translucent wall portion 21, for instance by an index matched glue.

Figure 5:
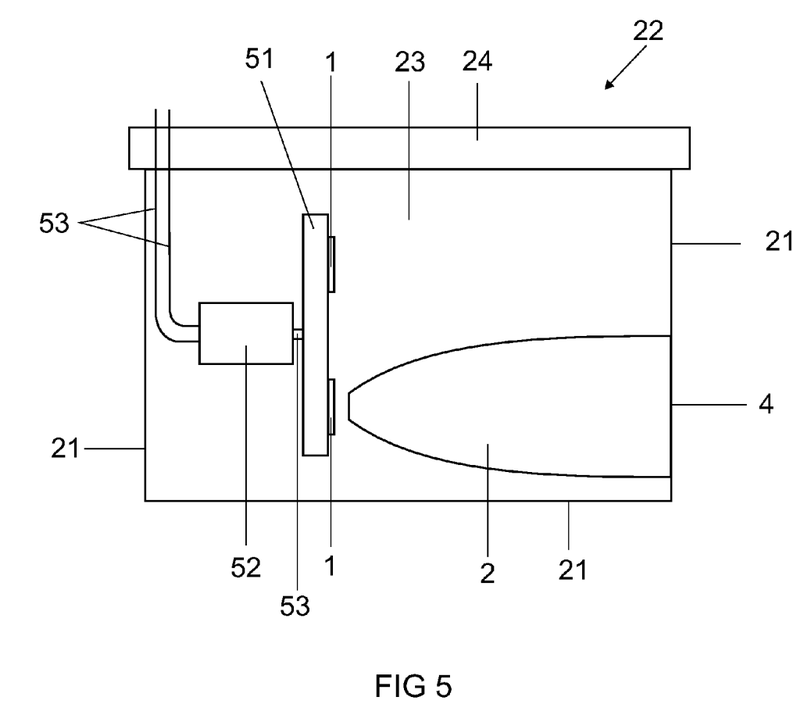
FIG. 5 shows a setup according to FIGS. 2A to 2C in combination with a phosphor wheel mounted rotatably.

FIG. 5 shows a container 22 as explained along FIGS. 2A to 2C, wherein the phosphor element is not provided on a static heat sink 7 but on a wheel 51, which is mounted rotatably. A brushless motor 52 is provided inside the immersion oil 23, whereby only the stationary (in terms of non-moving) cables 53 need to be sealed against the lid 24. The rotating shaft 53 is inside the immersion oil 23, which also acts as a lubricant.

The phosphor element has a ring-like shape, wherein only the section being in a focus point of the optical system 2 converts light; the section converting respectively is altered by turning the wheel 51.

Figure 6:
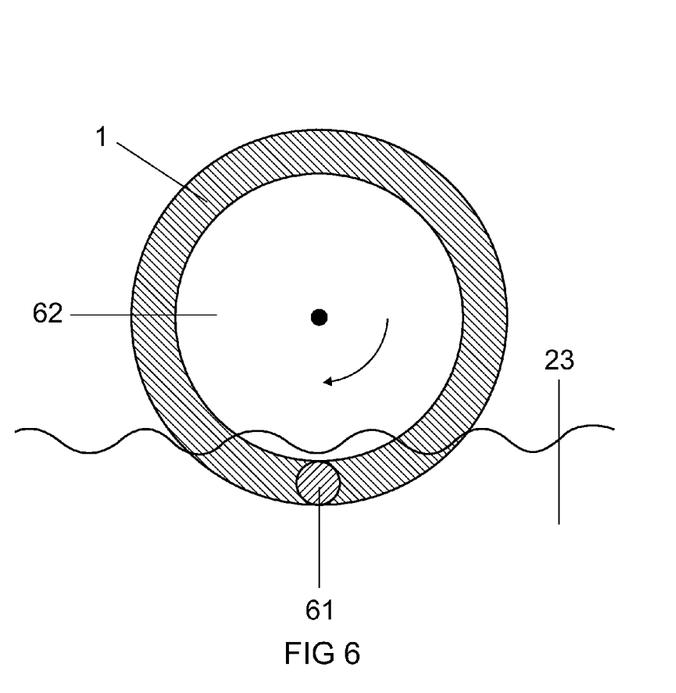
FIG. 6 shows a top view of a phosphor wheel in use.

FIG. 6 shows a top view of a respective ring-shaped phosphor element 1, which is provided on a disc 62 made of aluminum. The focus point 61 of the pump beam is arranged in the lower part and thus inside the immersion oil 23. This setup illustrates that the container 22 is not necessarily completely filled with immersion oil; since the optical system 2 and thus the focal point 61 are arranged in the lower part, a wetting of the gap 6 is ensured nevertheless.

Figure 7:
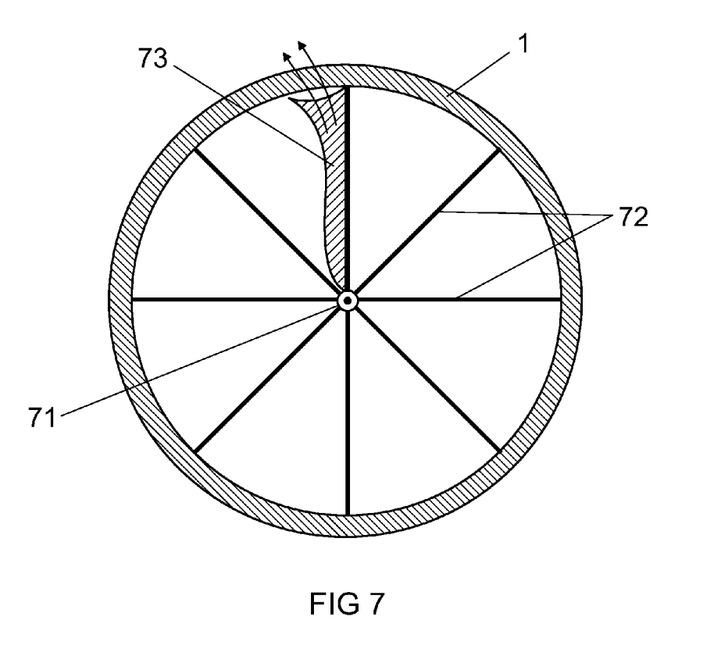
FIG. 7 illustrates a phosphor wheel with spokes in top view.

FIG. 7 shows an alternative phosphor wheel, wherein the ring-shaped phosphor element 1 is spaced to the rotational axis 71 by spokes 72. In this way, frictional forces between the immersion oil and the wheel are reduced.

The spokes' structure can for instance be punched out of an aluminum disc. Therein, blades 73 can be left at the spokes and be put into a shape for adjusting the flow of immersion oil 23 with respect to the phosphor element 1.

Figure 8:
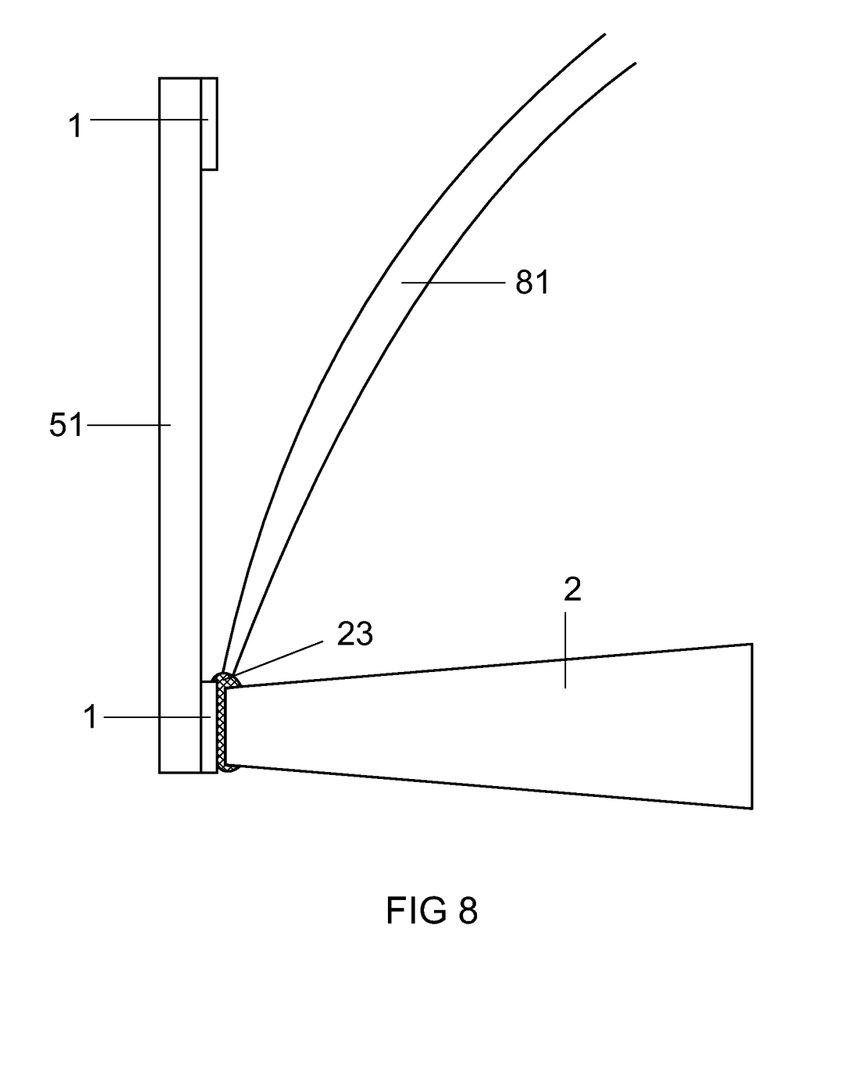
FIG. 8 shows a phosphor wheel in combination with a tube for feeding liquid immersion material to the gap between the phosphor element and the optical system.

FIG. 8 shows a setup with a phosphor wheel 51 and a ring-shaped phosphor element 1 thereon. Therein, the immersion oil can be fed from a reservoir through a tube 81 and be dispensed to the gap 6 by a nozzle. The supply of immersion material is driven by an electric pump, the operation of which can be set on simultaneously to the rotation of the phosphor wheel 51. Besides improving the optical properties, the immersion oil 23 can also act as a lubricant. The setup can for instance be provided in a container 22 as explained for FIGS. 2A to 2C.

Figure 9:
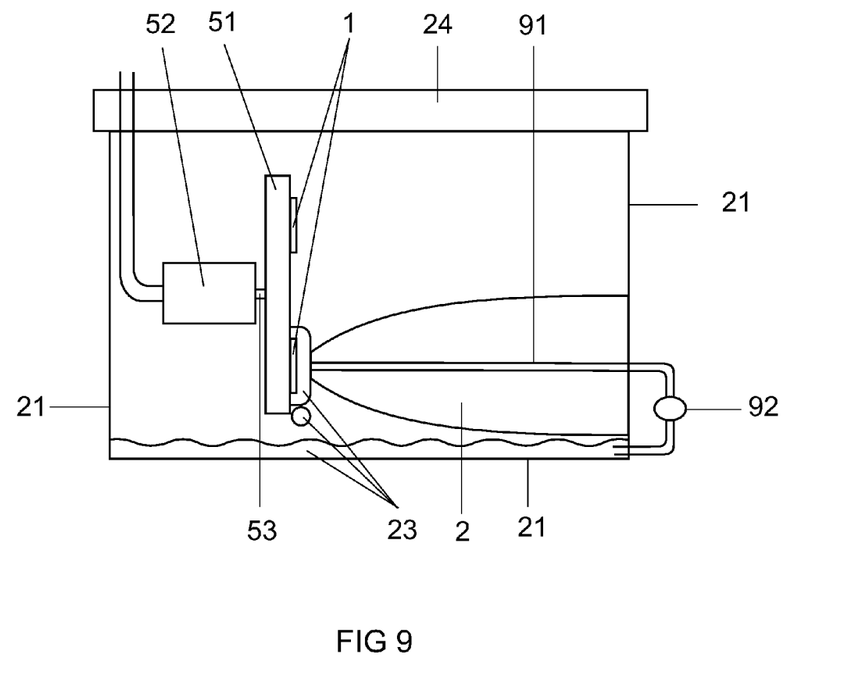
FIG. 9 illustrates a non-imaging optical element with an integrated channel structure.

FIG. 9 illustrates a similar setup, wherein the channel 91 for feeding immersion oil 23 to the phosphor element 1 is provided as a through-hole in the non-imaging optical system 2. The immersion oil 23 is fed to the gap 6, flows along the phosphor element 1, and is collected at the bottom of the container 22 after draining off the phosphor element 1. The pump 92 is in fluid connection with this reservoir and reclaims and pumps (i.e. recycles) the immersion oil 23 to the phosphor element 1.

While various embodiments have been particularly shown and described with reference to specific embodiments, it should be understood by those skilled in the art that various changes in form and detail may be made therein without departing from the spirit and scope of various embodiments as defined by the appended claims. The scope of various embodiments is thus indicated by the appended claims and all changes which came within the meaning and range of equivalency of the claims are therefore intended to be embraced.

The invention claimed is:

1. A phosphor assembly comprising: a phosphor element for converting pump light into converted light, an optical system for transmitting at least a part of at least one of said converted light and said pump light, a liquid immersion material, which can be provided between said phosphor element and said optical system, wherein said assembly and a total volume of said liquid immersion material are adapted for an excess of immersion material to enable an exchange of immersion material during phosphor assembly operation, such that not more than 50% of said total volume are penetrated by said light transmitted by said optical system,
wherein said optical system and said phosphor element are moveable with respect to each other,
wherein said phosphor element is mounted rotatably for a movement on a circular path around a rotational axis,
wherein a passageway for liquid immersion material is provided at said phosphor element radially inside said circular path for enabling a flow of liquid immersion material along said rotational axis,
wherein a guide is provided at said passageway for guiding said flow of said liquid immersion material with respect to said phosphor element,
wherein the phosphor element is ring-shaped and spaced to the rotational axis by spokes, wherein the structure of the spokes is punched out of an aluminum disc and wherein said guide is formed by blades, which are left at the spokes and are put into a shape for adjusting the flow of immersion oil with respect to the phosphor element.

2. The phosphor assembly according to claim 1, wherein at least a part of said optical system co-defines a volume sealingly, said volume containing said liquid immersion material.

3. The phosphor assembly according to claim 2, having a volume containing said liquid immersion material, wherein said volume is one of containing said phosphor element and being co-defined sealingly by at least a part of said phosphor element.

4. The phosphor assembly according to claim 2, wherein at least 5% of said volume are filled with said liquid immersion material.

5. The phosphor assembly according to claim 1 having a reservoir and a channel, wherein said liquid immersion material can be fed from said reservoir through said channel to said phosphor element.

6. The phosphor assembly according to claim 5 being adapted to transport liquid immersion material from said reservoir to said phosphor element, said liquid immersion material flowing along said phosphor element by gravitation or forced convection and being recirculated thereafter, preferably within a sealed volume containing said liquid immersion material.

7. The phosphor assembly according to claim 1, wherein a motor for driving said rotational movement is provided inside a volume containing said liquid immersion material scalingly.

8. A light source unit comprising a phosphor assembly comprising: a phosphor element for converting pump light into converted light, an optical system for transmitting at least a part of at least one of said converted light and said pump light, a liquid immersion material, which can be provided between said phosphor element and said optical system, wherein said assembly and the total volume of said liquid immersion material are adapted for an excess of immersion material to enable an exchange of immersion material during phosphor assembly operation, such that not more than 50% of said total volume are penetrated by said light transmitted by said optical system, and a pump light source for an emission of pump light,
wherein said optical system and said phosphor element are moveable with respect to each other,
wherein said phosphor element is mounted rotatably for a movement on a circular path around a rotational axis,
wherein a passageway for liquid immersion material is provided at said phosphor element radially inside said circular path for enabling a flow of liquid immersion material along said rotational axis,
wherein a guide is provided at said passageway for guiding said flow of said liquid immersion material with respect to said phosphor element,
wherein the phosphor element is ring-shaped and spaced to the rotational axis by spokes, wherein the structure of the spokes is punched out of an aluminum disc and wherein said guide is formed by blades, which are left at the spokes and are put into a shape for adjusting the flow of immersion oil with respect to the phosphor element.

9. A method for converting light, comprising: providing a phosphor element and converting pump light into converted light thereby, providing an optical system and transmitting at least a part of at least one of said converted light and said pump light thereby, providing a liquid immersion material between said phosphor element and said optical system, continuously exchanging said liquid immersion material between said phosphor element and said optical system during said conversion,
wherein said optical system and said phosphor element are moveable with respect to each other,
wherein said phosphor element is mounted rotatably for a movement on a circular path around a rotational axis,
wherein a passageway for liquid immersion material is provided at said phosphor element radially inside said circular path for enabling a flow of liquid immersion material along said rotational axis,
wherein a guide is provided at said passageway for guiding said flow of said liquid immersion material with respect to said phosphor element,
wherein the phosphor element is ring-shaped and spaced to the rotational axis by spokes, wherein the structure of the spokes is punched out of an aluminum disc and wherein said guide is formed by blades, which are left at the spokes and are put into a shape for adjusting the flow of immersion oil with respect to the phosphor element.

10. A light source unit comprising a phosphor assembly comprising: a phosphor element for converting pump light into converted light, an optical system for transmitting at least a part of at least one of said converted light and said pump light, a liquid immersion material, which can be provided between said phosphor element and said optical system, wherein said assembly and a total volume of said liquid immersion material are adapted for an excess of immersion material to enable an exchange of immersion material during phosphor assembly operation, such that not more than 50% of said total volume are penetrated by said light transmitted by said optical system,
wherein said optical system and said phosphor element are moveable with respect to each other,
wherein said phosphor element is mounted rotatably for a movement on a circular path around a rotational axis,
wherein a passageway for liquid immersion material is provided at said phosphor element radially inside said circular path for enabling a flow of liquid immersion material along said rotational axis, wherein a guide is provided at said passageway for guiding said flow of said liquid immersion material with respect to said phosphor element, wherein the phosphor element is ring-shaped and spaced to the rotational axis by spokes, wherein the structure of the spokes is punched out of an aluminum disc and wherein said guide is formed by blades, which are left at the spokes and are put into a shape for adjusting the flow of immersion oil with respect to the phosphor element.

11. The phosphor assembly according to claim 1, wherein a brushless motor for driving said rotational movement is provided inside a volume containing said liquid immersion material sealingly.

* * * * *

UNITED STATES PATENT AND TRADEMARK OFFICE
CERTIFICATE OF CORRECTION

PATENT NO.       : 9,103,526 B2                                     Page 1 of 1
APPLICATION NO.  : 13/883997
DATED            : August 11, 2015
INVENTOR(S)      : Dirk Berben et al.

It is certified that error appears in the above-identified patent and that said Letters Patent is hereby corrected as shown below:

In The Specification

Column 2, line 44: Please delete "$A_xB_y. C_2Al_5O_{12}$" between "form" and "(A, B, C" and write "$A_xB_yC_zAl_5O_{12}$" in place thereof.

Signed and Sealed this
Ninth Day of February, 2016

Michelle K. Lee
*Director of the United States Patent and Trademark Office*